(12) United States Patent
Sadati et al.

(10) Patent No.: US 11,469,753 B1
(45) Date of Patent: Oct. 11, 2022

(54) SWITCHING DRIVER CIRCUITRY

(71) Applicant: Cirrus Logic international Semiconductor Ltd., Edinburgh (GB)

(72) Inventors: Hamed Sadati, Swindon (GB); Yu Tamura, Kanagawa (JP)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/365,201

(22) Filed: Jul. 1, 2021

(51) Int. Cl.
| | |
|---|---|
| *H03K 17/10* | (2006.01) |
| *H03F 3/185* | (2006.01) |
| *G11C 5/14* | (2006.01) |
| *H02M 3/07* | (2006.01) |
| *H03K 19/00* | (2006.01) |
| *G05F 3/20* | (2006.01) |
| *G10K 11/34* | (2006.01) |

(52) U.S. Cl.
CPC .......... *H03K 17/102* (2013.01); *G05F 3/205* (2013.01); *G11C 5/146* (2013.01); *H02M 3/078* (2021.05); *H03F 3/185* (2013.01); *H03K 19/0027* (2013.01); *G10K 11/345* (2013.01); *H03K 2217/0018* (2013.01)

(58) Field of Classification Search
CPC ............ H03K 17/102; H03K 19/0027; H03K 2217/0018; H03F 3/185; G10K 11/345; G05F 3/205; G11C 5/146; G11C 5/145; H02M 3/078
See application file for complete search history.

(56) References Cited

U.S. PATENT DOCUMENTS

2021/0320654 A1* 10/2021 Kim .................. H03K 17/6874

* cited by examiner

*Primary Examiner* — Jung Kim
(74) *Attorney, Agent, or Firm* — Jackson Walker L.L.P.

(57) ABSTRACT

A switching driver circuit may have an output stage having an output switch connected between a switching voltage node and an output node. A switch network may control a switching voltage at the switching voltage node so that in one mode the switching voltage node is coupled to a positive voltage and in another mode the switching voltage node is coupled to ground voltage via a first switching path of the switch network. The circuit may also include an n-well switching block operable to, when the first switching voltage node is coupled to a positive voltage, connect the n-well of the first output switch to the switching voltage node, and, when the first switching voltage node is coupled to the ground voltage, connect the n-well of the first output switch to a first ground which is separate to the first switching voltage node and independent of the first switching path.

18 Claims, 5 Drawing Sheets

SWITCHING DRIVER CIRCUITRY

FIELD OF DISCLOSURE

The present application relates to switching driver circuitry and, in particular, to switching driver circuitry for driving a load.

BACKGROUND

Many electronic devices include transducer driver circuitry for driving a transducer with a suitable driving signal, for instance for driving an audio output transducer of the host device or a connected accessory, with an audio driving signal.

In many applications, transducer driving circuitry may comprise a switching driver, e.g. a class-D amplifier stage or the like, for generating the drive signal. Such switching drivers are relatively efficient, thus making them particularly useful in applications with a limited power source, such as transducer driving circuitry in a portable electronic device comprising a limited on-board power source, such as a battery.

A switching amplifier stage generally operates to switch an output node between defined high and low switching voltages, for instance between a high-side voltage VH and ground, with a duty cycle that provides a desired average output voltage, over the course of one or more duty cycles, for the drive signal. Generally the high and low switching voltage may differ from another by an amount that provides a desired output voltage range.

FIG. 1 illustrates an example of driver circuitry 100 for driving a load 101, such as a transducer, in a BTL (bridge-tied-load) configuration. FIG. 1 illustrates that each side of the load 101 is connected to a respective driver 101-1 and 101-2. The output node 103 of each driver 101-1 and 101-2 is switched between a high-side voltage VH and a low-side voltage VL, for example between a positive supply voltage and ground, with controlled duty cycles so as to control the voltage across the load 101. FIG. 1 illustrates that each of the drivers 101-1 and 101-2 comprise switches 102a and 102b, which may be typically implemented as MOSFETs, for selectively connecting the output node 103 of the driver to the high-side voltage or the low-side voltage. Modulators 105-1 and 105-2 control the duty-cycle of the switching of the switches 102a and 102b of the respective driver 102-1 and 102-2 based on the input signal. The modulators 105 may generate PWM or PDM switching signals based on the input signal as will be understood by one skilled in the art. The drivers 101-1 and 101-2 can thus be seen as generating respective first and second drive signals which are components of a differential driving signal for driving the load.

In at least some applications, it may be desirable to generate drive signals with relatively high amplitudes, for example with a peak-to-peak voltage range of the order of tens of volts or so. This may therefore typically require the input voltage for the driver 102, i.e. the voltage difference between VH and VL, to be relatively high to provide the required output range.

Using such high input voltages can, however, result in relatively large voltages stresses across the switches of the driver, which may require the use of devices with high voltage tolerances, which may not be practical for some applications, or which may add to the cost of the circuitry. Also, switching the output node between switching voltages that differ by a relatively large amount can lead to an undesirably high amount of current ripple and/or generate EMI.

SUMMARY

Embodiments of the present disclosure thus relate to improved driving circuits.

According to a first aspect there is provided a switching driver circuit for driving a load, the switching driver circuit comprising an output stage comprising: an output node for outputting a driving signal to the load and a first output switch connected between a first switching voltage node and the output node, wherein the first output switch comprises an n-well. The switching driver circuit also comprises a switch network operable to control a switching voltage at said first switching voltage node, wherein the switching driver circuit is operable in a plurality of modes in which the first switching voltage is different in each mode. The plurality of modes comprises at least: a mode in which the first switching voltage node is coupled to a positive voltage; and a mode in which the first switching voltage node is coupled to a ground voltage supply via a first switching path of the switch network. The switching driver circuit further comprises an n-well switching block operable, when the first switching voltage node is coupled to a positive voltage, to connect the n-well of the first output switch to the first switching voltage node, and operable, when the first switching voltage node is coupled to the ground voltage supply, to connect the n-well of the first output switch to a first ground node at a ground voltage, where the first ground node is separate to the first switching voltage node and independent of the first switching path.

In some implementations, the first switching path may comprise at least a first supply switch with a terminal connected to the first switching voltage node and the first supply switch may comprise an n-well. The n-well switching block may be further operable, when the first switching voltage node is connected to the ground voltage supply, to connect the n-well of the first supply switch to the first ground node. The n-well switching block may be operable, when the first switching voltage node is connected to a positive voltage, to connect the n-well of the first supply switch to the first switching voltage node.

In some implementations the output stage may further comprise a second output switch connected between a second switching voltage node and the output node, wherein the second output switch comprises an n-well. The switch network may also be operable to control the voltage at the second switching voltage node such that the second switching voltage is different in each mode. The n-well switching block may be further configured to control a voltage supplied to n-well of the second output switch based on the second switching voltage.

In some examples, in one mode of operation, the second switching voltage node may be coupled to the ground voltage supply via a second switching path that comprises at least a second supply switch of the switch network. The n-well switching block may be operable, when the second switching voltage node is coupled to the ground voltage supply, to connect the n-well of the second supply switch to the first ground node, wherein the first ground node is independent of the second switching path. In other examples, the n-well of the second output switch may be connected to the n-well of the first output switch.

In some implementations, a terminal of the second supply switch may be connected to the second switching voltage node and the second supply switch may comprise an n-well. The n-well switching block may be further configured to control a voltage supplied to n-well of the second supply switch to be the same as the voltage supplied to the n-well of the second output switch.

In some examples, the n-well switching block may comprises a first n-well block switch for selectively connecting a first n-well voltage node to the first switching voltage node, wherein the first n-well voltage node is coupled to the n-well of the first output switch. The n-well switching block may further comprise a second n-well block switch for selectively connecting the first n-well voltage node to a supply select node; a third n-well block switch for selectively connecting the supply select node to the first ground node; and a fourth n-well block switch for selectively connecting the supply select node to a positive voltage supply node.

The n-well switching block may be configured such that, when the first switching voltage node is connected to the ground voltage supply: the first n-well block switch is open to disconnect the first n-well voltage node from the first switching voltage node; the second and third n-well block switches are closed to connect the n-well node voltage to the first ground node; and the fourth n-well block switch is open.

The switching driver circuit may be operable in a mode in which the first switching voltage node is coupled to a positive voltage substantially equal to a voltage of the positive voltage supply node and in which: the first n-well block switch is closed to connect the first n-well voltage node to the first switching voltage node; the second n-well block switch is open to disconnect the first n-well voltage node from the supply select node; and the third n-well block switch, with the fourth n-well block switch closed so that the supply select node is coupled to the first ground node.

The switching driver circuit may be operable in a mode in which the first switching voltage node is coupled to a positive voltage which is more positive than a voltage of the positive voltage supply node and in in which: the first n-well block switch is closed to connect the first n-well voltage node to the first switching voltage node; the second and third n-well block switches are open to disconnect the n-well voltage node from the supply select node; and the fourth n-well block switch is closed to connect the supply select node to the positive voltage supply node.

Where the output stage comprises a second output switch connected between a second switching voltage node and the output node, and the second output switch comprises a n-well, the n-well of the second output switch may be coupled to either the first n-well voltage node or the supply select node of the n-well switching block.

The plurality of modes of operation of the switching driver circuit may comprises a first mode in which the network of switches is configured to connect the first switching voltage node to a positive input voltage supply and to connect the second switching voltage node to said ground voltage supply. The plurality of modes may comprise a second mode in which the network of switches is configured to connect the first switching voltage node to said ground voltage supply and to connect the second switching voltage node to a negative boosted voltage. The plurality of modes may comprise a third mode in which the network of switches is configured to connect the first switching voltage node to a positive boosted voltage and to connect the second switching voltage node to a negative boosted voltage.

The switching driver circuit may comprise a capacitor and the network of switches may be operable such that the capacitor can be charged between the positive input voltage supply and the ground voltage supply and selectively connected in series with the positive input voltage supply to provide the positive boosted voltage or connected in series with the ground voltage supply to provide the negative boosted voltage.

In some implementations, the output stage is a first output stage and the switching driver circuit may further comprise a second output stage and the switching driver circuit may be configured to drive the load in a bridge-tied-load configuration between the first and second output stages.

In some examples the load may be at an audio output transducer or a haptic output transducer. In some examples the load may be a piezoelectric transducer or a ceramic transducer.

Aspects also relate to electronic device comprising the switching driver circuit of any of the embodiments described herein.

In another aspect, there is provided a switching circuit for controlling an n-well voltage of an n-well of a first transistor switch which is connected by a first terminal to a controlled voltage node, where a voltage of the controlled voltage node is controllably variable. The switching circuit comprises a plurality of switches interconnecting the n-well of the first switch, the first terminal of the first switch and a ground voltage node. The switching circuit is operable such that when the voltage of the controlled voltage node connected to the first terminal is positive, the n-well of the first switch is connected to the first terminal and when the voltage of the controlled voltage node connected to the first terminal is at ground or negative, the n-well of the first switch is connected to the ground voltage node, wherein the voltage of the ground voltage node is independent of the voltage at the first terminal.

In a further aspect there is provided a switching circuit comprising an output stage for selectively connecting an output node to a first controlled voltage node, wherein the switching circuit is operable in at least a first mode in which the first controlled voltage node is connected to a positive voltage and a second mode in which the first controlled voltage node is connected to a ground supply via a first switching path. A controller is configured to control the mode of operation of the switching driver circuit and the controller is also configured to control a voltage applied to a n-well of at least a first switch of the output stage or first switching path with a terminal connected to the first controlled voltage node. The controller is configured such that when the switching circuit operates in the first mode, the n-well of the first switch is connected to said positive voltage and when the switching circuit operates in the first mode, the n-well of the first switch is connected to a ground voltage which is independent of the first switching path.

It should be noted that, unless expressly indicated to the contrary herein or otherwise clearly incompatible, then any feature described herein may be implemented in combination with any one or more other described features.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

The present application relates to switching driver circuitry for driving a load that is operable in a plurality of different driver operating modes, wherein the switching voltages vary in the different driver operating modes. In each mode, the switching driver operates to switch the driver output node between the relevant switching voltages with a controlled duty cycle so as to provide the drive signal with an average voltage (over the course of one or more cycle periods) within a voltage range defined by the switching voltages. However, in a different driver mode of operation, the switching voltages are different so as to provide, in that driver mode, a different voltage range for the drive signal. The overall output voltage range for the switching driver may thus be defined by the different driver modes of operation, and each individual driver mode of operation may provide only part of the overall output voltage range, that is the voltage range between the two switching voltages in a given mode forms only a part or a subset of the overall output voltage range.

By operating the switch driver circuit in a plurality of modes, a maximum peak-to-peak voltage variation for the driver signal can be achieved using switching voltages with a voltage difference which is lower than the peak-to-peak variation and varying the switching voltages in use. Using switching voltages with a lower voltage difference can be beneficial in terms of reduced switching losses and reduced radiated emissions, as well as reducing the requirement for a significant output inductance.

Figure 1:
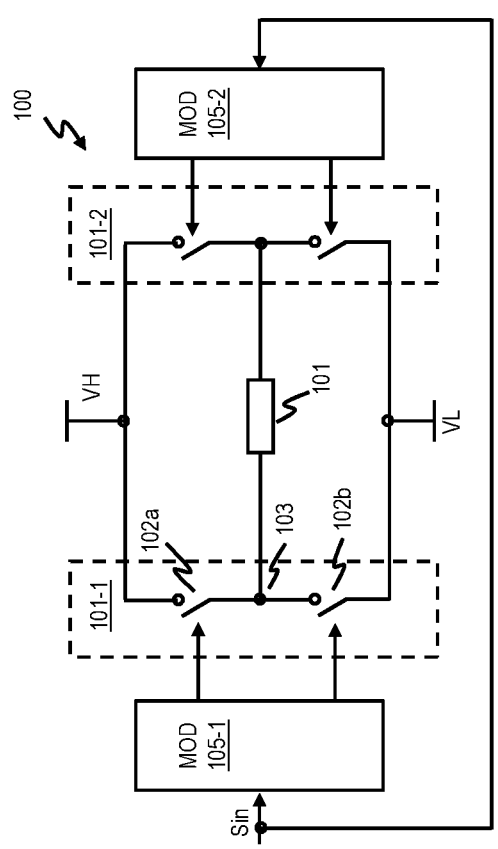
FIG. 1 illustrates one example of a driver circuit for driving a load in a bridge-tied-load configuration.
Figure 2:
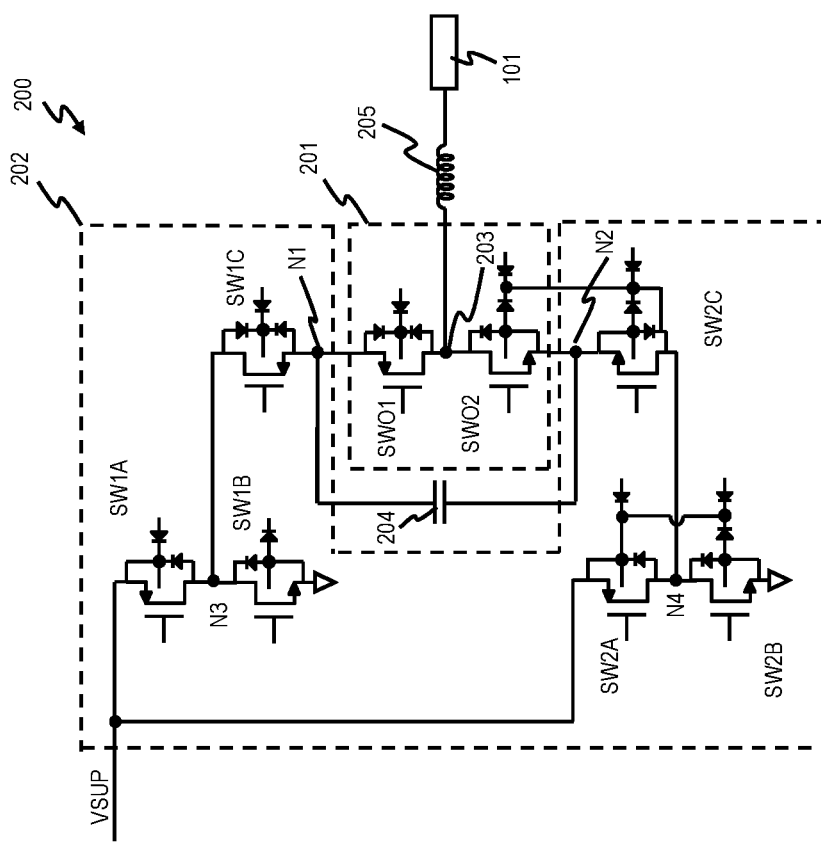
FIG. 2 illustrates one example of a switching driver circuit.

FIG. 2 illustrates one example of a switching driver circuit 200 which is operable in different driver operating modes with different switching voltages. The switch driver circuit comprises an output stage 201 and a switch network 202.

Output stage 201 comprises an output node 203 for outputting a drive signal to one side of load 101. The switching driver 200 may be implemented as a single ended driver, to drive one side of the load, or may be configured with another switching driver to drive the load in a BTL configuration. In some implementations an inductor 205 may be coupled between the output node 203 and load 101. The inductor 205 may at least partly help suppress ripple in the drive signal supplied to the load 101.

The output stage 201 comprises two output switches SWO1, SWO2 for selectively connecting the output node 203 to a first node N1 or a second node N2. The switch network 202 is configured to selectively control the switching voltages at the first and second voltage nodes N1 and N2 to enable the switching driver circuit to operate in various modes of operation. The output stage 201 is thus effectively a conventional half-bridge output stage, but the switch network 202 is operable to vary the switching voltages for the output stage at nodes N1 and N2. The switch network is connected to input supply nodes for receiving high and low supply voltages, that define an input voltage. In the example of FIG. 2 the high and low supply voltages are a positive voltage VSUP and ground respectively, and thus the input voltage is equal to VSUP.

The switch network 202 is connected to, in use, a capacitor 204. The switch network is arranged such that the capacitor 204 can be charged to a desired voltage, which in this case is the supply voltage VSUP. The switch network is also arranged so that the charged capacitor 204 can selectively provide voltage boosting to one of the first and second voltages nodes N1, N2, in one of the driver modes of operation.

In the example of FIG. 2, the capacitor 204 is connected between the first and second voltage nodes N1 and N2 and thus in parallel with the output bridge stage 202. This arrangement means that the voltage difference between the switching voltages corresponds to the voltage on the capacitor 204.

In the example of FIG. 2, the switch network 202 is arranged to provide a first set of switches SW1A, SW1B and SW1C and a second set of switches SW2A, SW2B and SW2C. Switches SW1A and SW1B are provided to selectively connect a node N3 to the high-side input voltage or the low-side input voltage respectively, i.e. VSUP and ground in this example. The node N3 can thus be seen as a variable supply node or a supply select node. Switch SW1C selectively connects the node N3 to the first voltage node N1. Likewise, switches SW2A and SW2B selectively connect a node N4 to the high-side input voltage or the low-side input voltage respectively and switch SW2C selectively connects the node N4, which can be seen as a second variable supply, or supply select, node, to the second voltage node N2. This arrangement means that a first electrode of the capacitor 204 can be selectively connected to either of the first or second input supplies. Likewise, a second electrode of the capacitor 204 can be selectively connected to either of the first or second input supplies.

In use, the driver circuit may be selectively operable in three different driver modes of operation, where the voltages at the switching voltage nodes N1 and N2, and hence the switching voltages for the output stage 203, vary in each mode.

In one mode of operation, the switching voltages may be VSUP and ground. This mode thus uses the supply voltages as the switching voltages and will be referred to herein as an unboosted mode (although it will be understood that this means the switching driver 200 does not itself provide any voltage boosting—as noted above there may have been some prior voltage boosting applied to generate VSUP). In another mode of operation, which will be referred to as a positive boosted mode, the switching voltages may be +2VSUP and +VSUP. In a further mode of operation, which may be referred to a negative boosted mode, the switching voltages may be ground and −VSUP. By swapping between these three modes of operation the switching driver circuit 200 can provide a peak-to-peak voltage range of 3VSUP in magnitude, from −VSUP to +2VSUP.

To provide the unboosted mode of operation, the switch network may be operable in a switch state in which switches SW1A and SW1C may be closed (with switch SW1B open) to connect the high-side supply voltage VSUP to the first voltage node N1, and the switches SW2B and SW2C may be closed (with switch SW2A open) to connect the second voltage node N2 to the low-side supply voltage, i.e. ground in this example. This results in the switching voltage nodes N1 and N2 being connected to the respective high-side and low-side supply voltages. Whilst in this second state, the output bridge stage 201 can be controlled so that switches SWO1 and SWO2 alternately connect the output node 203 to the first and second voltage nodes N1, N2 with a duty cycle controlled to provide the desired average output voltage in the range 0V to +VSUP.

In this unboosted mode of operation, the capacitor 204 is also connected between the high-side and low-side supply voltages and thus is charged to the supply voltage +VSUP.

To provide the positive boosted mode of operation, the switch network 201 is operable in a switch state in which switch SW2A is closed (with switch SW2B open) to connect node N4 to the high-side supply voltage VSUP and switch SW2C is closed to connect node N4 to the second switching voltage node N2. In this state, the second switching voltage node N2 is thus substantially equal to the high-side supply voltage +VSUP. Switch SW1C is open, and the voltage of the capacitor 204, which is charged to the input voltage Vin, in this case equal to +VSUP, positively boosts the voltage at the first voltage node N1 to +2VSUP.

In this switch state for the positive boosted mode, the voltage at the first switching voltage node N1 is boosted to +2VSUP (i.e. boosted above the high-side supply voltage VSUP by the voltage Vin on the capacitor 204), and thus this node is disconnected from the supply voltages. It will be noted that if switch SW1C were not present, this disconnection could be achieved by opening both switching paths SW1A and SW1B. However, in that case the voltage at node N3 would be the same as that at the first switching voltage node N1, i.e. equal to +2VSUP and thus the voltage across switch SW1B would be equal to +2VSUP, i.e. this switch would be subjected to a voltage stress of twice the input voltage. The inclusion of switch SW1C reduces the voltage stress. Switch SW1C is open, to disconnect the first switching voltage node N1 from the first supply select node N3, but the switch SW1A may be closed (with switch SW1B open) to connect node N3 to the high-side supply voltage VSUP. This limits the voltage difference across the switch of the open switch SW1C to a voltage of magnitude equal to the supply voltage VSUP. Thus, the maximum voltage difference across any of the switches is substantially equal to the magnitude of the supply voltage VSUP.

Whilst in this switch state, the output bridge stage 201 can be controlled so that the output switches SWO1 and SWO2 alternately connect the driver output node 203 to first and second switching voltage nodes with a duty cycle controlled to provide the desired average output voltage within the range +VSUP to +2VSUP.

To provide the negative boosted mode of operation, the switch network 202 may be operable in a switch state in which switches SW1B and SW1C are closed (with switch SW1A open) to connect the first voltage node N1 to the low-side supply voltage, i.e. ground. The first switching voltage node N1 is thus substantially equal to the low-side supply voltage, i.e. ground in this example. Switch SW2C is open to connect one electrode of the capacitor to the second voltage node N2. In a previous switch state, the voltage on the capacitor may have been charged to +VSUP. Opening switch SW2C thus connects the voltage of the capacitor 204, which may be charged to the input voltage, i.e. VSUP in this case, to negatively boost, or lowers, the voltage at the second voltage node N2 to −VSUP. To control the voltage stress across the switch SW2C, the switch SW2B may be closed to cause the voltage at node N4 to be equal to ground.

Whilst the switch network of the variable boost stage is in this switch state for the negative boosted mode, the output bridge stage 201 can be controlled so that the output switches SWO1 and SWO2 alternately connect the driver output node 203 to first and second switching voltage nodes with a duty cycle controlled to provide the desired average output voltage within the range −VSUP to 0V.

It will be understood that the switch network 202 is operable to controllably vary the voltages at the voltage nodes N1 and N2 to provide different switching voltages for the output stage 201 in the different driver modes of operation. One of switching voltages in the positive boosted and negative boosted modes of operation is selectively boosted by the voltage of the capacitor 204, which may be charged during operation in the unboosted mode by the input voltage, i.e. the voltage between the high-side supply voltage and the low-side supply voltage, VSUP and ground in this example. Each of the operating modes therefore involves switching voltages that differ from one another by a magnitude equal to the supply voltage VSUP, i.e. the difference between the high-side and low-side supply voltages. In the embodiment of FIG. 2 the capacitor is charged to the supply voltage VSUP and as the capacitor is connected in parallel with the output stage 201, the switching voltages in a given mode of operation differ by an amount equal to the supply voltage VSUP. In the embodiment of FIG. 2 one capacitor may be used to selectively provide both positive boosting or negative boosting as required.

It will also be clear that the maximum voltage stress across any of the switches can be limited to be substantially equal to the supply voltage VSUP. As illustrated each switch may implemented with a transistor, e.g. a MOSFET, as a switch and this means that a drain-source voltage tolerance of the transistor need only be sufficient to withstand a voltage of magnitude equal to the supply voltage VSUP.

The supply voltage for the switching driver 201 may thus define the voltage tolerance required for the switches of the switch network of the switch driver circuit 200 and also define the voltage range of the different operating modes, and hence the overall voltage range of the switching driver.

In some examples the supply voltage VSUP may be a voltage of several voltage or tens of volts, say 20V for example. For the example illustrated in the FIG. 2, the switching driver 200 may thus be operable to generate a drive signal with a voltage range of 60V, from a voltage of −20V to a voltage of +40V, by selectively operating in one of the three different operating modes, a −20V to 0V mode, a 0V to +20V mode and a +20V to 40V mode. The supply voltage VSUP may be derived from a suitable power supply voltage, e.g. from a battery voltage, which may be boosted upstream by some suitable DC-DC converter (not shown) to provide the supply voltage VSUP.

As illustrated in FIG. 2, the switches of the switch network 202 may be implemented as MOSFET devices. In the example switches of FIG. 2, switches SW1A, SW1C, SW2A and SWO1 are implemented as PMOS devices and switches SW1B, SW2B, SW2C and SWO2 are implemented as NMOS devices, but it will be understood that other implementations are possible. As one skilled in the art will be familiar with, such MOSFET devices may be at least partly formed within an n-well so as to provide isolation from the p-type substrate.

Figure 3B:
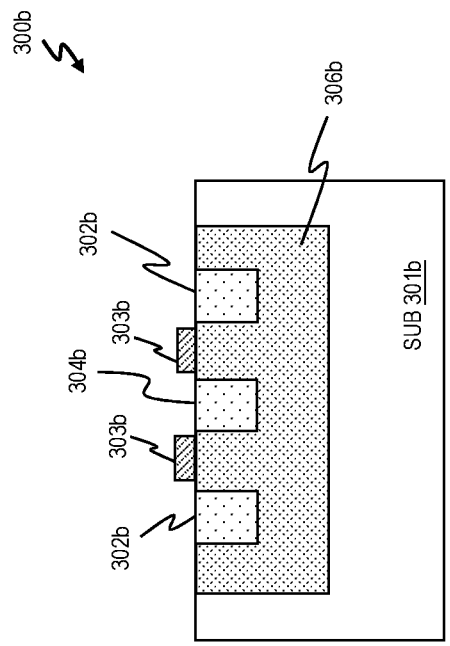
FIGS. 3a and 3b illustrate examples of NMOS and PMOS devices, respectively, for use in a driver circuit.
Figure 3A:
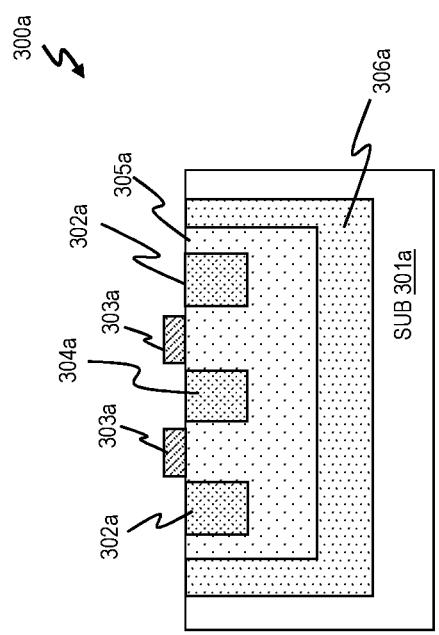

FIGS. 3a & 3b illustrate the principles of MOSFET devices that comprise an n-well. FIG. 3a illustrates a simplified cross-section through an NMOS device 300a formed on a substrate 301a. The NMOS device 300a comprises a source region 302a and a drain region 304a, with a gate electrode 303a for control conduction via the channel as would be understood by one skilled in the art. The source 302a and drain 304a are formed in a p-well bulk region 305a. The p-well bulk region 305a is formed in NW 306a (which in this case comprises a deep n-well), which isolates the bulk region 305*a* from the substrate 301*a* and other devices. FIG. 3*b* illustrates a simplified cross-section through a PMOS device 300*b* that again comprises a source 302*b* and drain 304*b* and gate electrode 303*b*. In this case, there is an n-well 306*b* which forms at least part of the bulk or body region for the p-type source and drain 302*b* and 304*b*.

In some implementations, especially when the switching driver circuit is operable within an input voltage of the order of 20V or so, the n-wells of at least some of the switches may be driven with a voltage that varies in accordance with the switching voltages. The voltage of the n-well may be driven according to the switching voltages to avoid p-well to n-well breakdown or unwanted forward biasing of the n-well to the substrate or p-well. Typically, to drive the n-well in this way, the n-well may be connected to the same voltage node as one of the source or drain terminal of the relevant MOSFET device. For the example discussed above, where the maximum source-drain voltage stress is limited to the magnitude of the input voltage, e.g. VSUP, it may also be beneficial for the voltage difference between the n-well and the source and drain terminals of the MOSFET device to be no greater than the input voltage.

For instance, in the example of FIG. 2, the source terminal of switch SWO1 and SW1C is connected to node N1 which may selectively be controlled to be +VSUP, +2VSUP or ground. When switch SWO1 is on its drain terminal will also be at the same voltage but when switch SWO1 is off, and switch SWO2 is on, the output node 203 and hence the drain terminal of SWO1 will be equal to the low-side switching voltage. It may be desirable to control the n-wells of this switch to match the voltage at node N1. Likewise the switch SW1C is also connected to node N1 and thus, to ensure correct operation, the n-well of switch SW1C may be matched to the voltage at node N1. To drive the n-wells of switches SWO1 and SW1C accordingly, the n-wells of these switches may conveniently be connected to node N1.

In a similar manner, the switches SWO2 and SW2C are connected to node N2 which may selectively be controlled to be ground, +VSUP or −VSUP. It may be desirable to control the n-wells of these switches to match the voltage at the node N2, i.e. to be equal to VSUP when the voltage at node N2 is equal to VSUP, and to be at ground when the voltage at node N2 is ground, however in general driving the n-wells with a large negative voltage is undesirable and so when the voltage at node N2 is at −VSUP, the n-wells of switches SWO2 and SW2C may be held at ground. Conveniently this could be achieved by connecting the n-wells of these switches to node N4.

Switches SW1B and SW2B are connected to nodes N3 and N4 respectively, which may vary between VSUP and ground, and it may be desirable for the n-wells of these switches to be at VSUP when the relevant node is at VSUP, which can be achieved by connecting the n-wells of switches SW1B and SW2B to nodes N3 and N4 respectively. Switches SW1A and SW2A are also connected to nodes N3 and N4 respectively, but these switches are also connected to VSUP, so the n-wells may simply be maintained at VSUP in use.

It has been recognised, however, that operating with such high switching voltages may result in relatively high current spikes in use, which can result in undesirable leakage current via a diode associated with the n-well of some of the switches, i.e. the MOS devices.

Consider again the negative boosted mode of operation. In this mode, switches SW1B and SW1C are closed (with switch SW1A open) to connect the first voltage node N1 to the ground supply. Switch SW2C is open to connect capacitor 204 to second voltage node N2, which drives the voltage at the second voltage node N2 to −VSUP.

The voltage at the first node N1 is thus nominally at ground. However, in use when the first output switch SWO1 is closed, a load current can flow the load via switches SW1B and SW1C and SWO1.

Switching voltages that differ from one another by tens of volts, e.g. of the order of 20V or so, can result in a relatively large load current being drawn (e.g. of the order of 1 A).

The switches SW1B and SW1C will each have some on-resistance, and may in some examples have an on-resistance of between 0.25Ω to 0.5Ω. In use, the relatively large load current through these switches may thus result in the voltage at the node N1 being pulled below ground by more than a diode voltage. If the voltage at the node N1 goes below ground, and the n-wells of switches SW1C and SWO1 are also at this voltage, this may cause the diode between the n-well and p-substrate of these devices to become forward biased to a sufficient extent to allow conduction. It will be appreciated that the substrate will generally be grounded, and as the grounding of the substrate does not vary in use, the substrate will be grounded by a separate connection to ground. If the voltage of the n-well thus goes sufficiently below ground, a diode between the n-well and substrate may start conducting. This, can thus, result in current leakage to the substrate of the switches SW1C and SWO1, which is undesirable.

A similar problem can occur with switches SW2C and SWO2 in the unboosted mode of operation, where the switching voltage at node N2 is nominally ground. In use a significant load current may flow via switches SW2B and SW2C and the voltage at node N4 may be pulled below ground by the on-resistance of SW2B, which could cause unwanted n-well diode conduction in switches SW2C and SWO2.

Embodiments of the present disclosure thus relate to switching driver circuitry that is operable to selectively switch the n-well of one or more of the switches of the switching driver circuit in a way that prevents such unwanted leakage current. In particular, in cases where the n-well of the relevant switch may be switched to match the switching voltage at a node that forms an output path for one of the switching voltages, then in cases where the relevant switching voltage is ground, the n-well may be switched to a defined ground supply that is separate to and independent of the output path (i.e. the path between the ground supply and the output node).

Switching circuitry according to examples of the present disclosure may thus connect a n-well of the first output stage switch SWO1 to a first ground node, different from the first switching voltage node N1, when the first switching voltage node N1 is connected to the ground supply by a switching path of the switch network. The first ground node may be a node that is operable to receive a ground voltage, but which is not connected to the output node 203 and thus does not provide a connection to the load. As such, when the n-well is connected to the first ground node, it will be driven with a ground voltage that is not pulled below ground (in the same way as the ground voltage at the first voltage node N1). Therefore, whilst the voltage at the first voltage node N1 may, in use, be pulled below ground, the n-well ground voltage remains at ground, which applies no voltage bias to the diode between the n-well and the substrate. As such, this avoids any significant current leakage to the substrate. An n-well of the MOS device of switch SW1C may also be connected to the first ground node in a similar way to avoid current leakage.

As one skilled in the art will understand, it is common for the source and bulk of MOS devices to be connected to one another, so as to be driven to the same voltage in use, and some devices may thus have the source and bulk terminals effectively hardwired together. For PMOS devices, selectively switching the n-well as described requires that the bulk and source terminals can be switched separately and thus PMOS devices without a hardwired connection between the source and bulk should be used.

Figure 4:
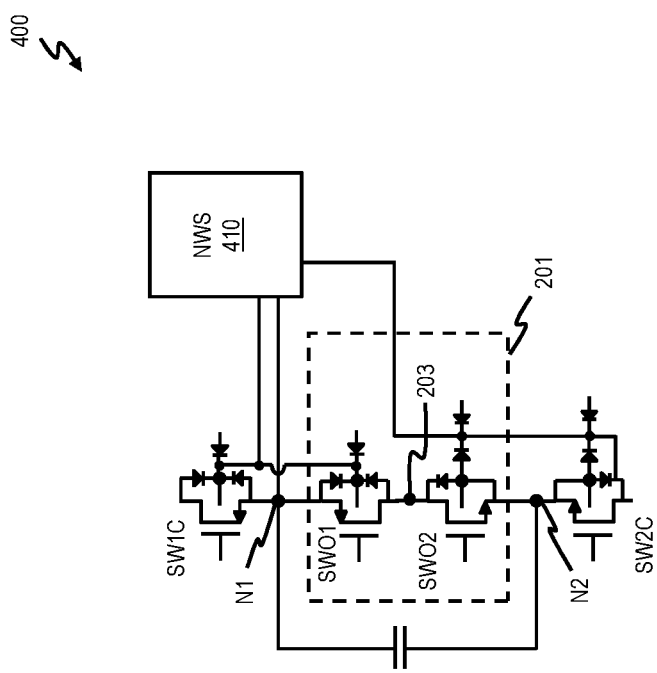
FIG. 4 illustrates another example of a driver circuit.

FIG. 4 illustrates an example of switch driver circuitry 400 according to an embodiment, and illustrates that the switch driver circuit may comprises output stage 201 and switches SW1C and SW2C, as described above with regard to FIG. 2 (the rest of the switch driver circuitry 200 has been omitted from FIG. 4 for clarity).

Switch driver circuitry 400 comprises n-well switching block (NWS) 410 operable to connect respective n-wells of switches SW1C and SWO1 to a ground node that is different from the first voltage node N1. As described above, when the switch driver circuit 400 is configured in a mode that involves the first voltage node N1 being connected to ground, such as the negative boosted mode describe above, a load current via the relevant switch path can result in the voltage at the first voltage node N1 being pulled below ground and cause leakage to the substrates of switches SW1C and SWO1. Connecting the n-wells of switches SW1C and SWO1 to a node that which is at ground and which is independent of the output path, and thus is not pulled below ground, may prevent diodes between the n-wells and substrate of switches SW1C and SWO1 from turning on and may thus avoid the current leakage to substrate at these switches.

NWS 410 may also be operable to connect the n-wells of the switches SW1C and SWO1 to the first voltage node N1 in other modes of operation, i.e. when the switching voltage at the first voltage node N1 is different to ground, such as in the unboosted mode when N1 is at VSUP or the positive boosted mode when N1 is at +2VSUP. In such modes, the voltage at node N1 is sufficiently positive that current draw experienced at the first voltage node N1 may not be an issue and may not cause the current leakage effects that can occur at switches SW1C and SWO1. Connecting the n-wells of switches to node N1 in these modes of operation is a convenient way to ensure the n-wells are suitably biased for the switching voltages used in these modes.

As such, when the first voltage node N1 is not receiving a ground voltage, the NWS 410 may be operable to connect the n-wells of switches SW1C and SWO1 to the first switching voltage node N1.

Figure 5:
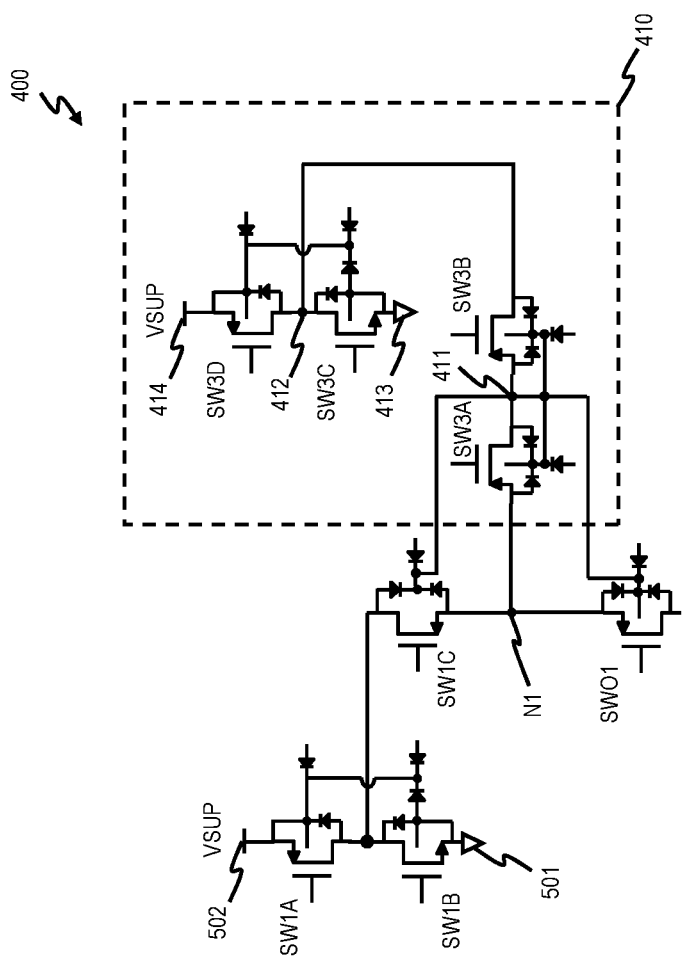
FIG. 5 illustrates another example of a driver circuit.

FIG. 5 illustrates one example of how the n-well switching of NWS 410 may be implemented.

In this example NWS 410 comprises four n-well block switches SW3A, SW3B, SW3C and SW3D, which for the purposes of the present disclosure may be termed 'NW switches'. First NW switch SW3A is operable to connect a NW node 411 to the first voltage node N1. The NW node 411 provides a connection to the n-wells of both the first output stage switch SWO1 and switch SW1C, which will be referred to a 'first supply switch'. Second NW switch SW3B is operable to connect the NW node 411 to a supply select node 412. Third NW switch is operable to connect the supply select node 412 to a first ground node 413 and fourth NW switch is operable to connect the first supply select node 412 to a first positive voltage supply node 414.

As described above, switch driver circuit 400 may be operable in a plurality of modes, in which the voltage received at first voltage node N1 may vary. NWS 410 may be operable in a plurality of switch states depending on the mode of the switch driver circuit 400, to selectively connect the NW node 411, and hence the n-wells of switches SW1C and SWO1 to the first ground node 413 or the first voltage node N1.

In the negative boosted mode of operation, switching path SW1B and SW1C are closed (with switching path SW1A open) to connect the first voltage node N1 to ground node 501, i.e. the low side supply, and the first voltage node N1 is thus connected to a ground node. In this mode, the NWS may be operable in a first NW switch state to connect the n-wells of switches SW1C and SWO1 to the first ground node 413.

In the first NW switch state, SW3A is open to disconnect the NW node 411 from first voltage node N1, thus disconnecting the n-wells of switches SW1C and SWO1 from the first voltage node N1. Further, in the first NW switch state, SW3B and SW3C are closed, with SW3D open, to connect the NW node 411 to first ground node 413. As such, the n-wells of switches SW1C and SWO1 are disconnected from the first voltage node N1, and thus not affected by any voltage variation on this node. Instead, the n-wells of switches SW1C and SWO1 are connected to first ground node 413, which is not part of the output path and thus remains at ground. The first ground node is independent of the switching path established between the first switching voltage node and the ground supply, in that it does not exhibit any variation in voltage due to current flow in this switching path.

When the switch driver circuitry 400 operates in ether the unboosted or positive boosted modes of operation, in which the first voltage node N1 is nominally at VSUP or +2VSUP, the n-wells of switches SWO1 and SW1C may advantageously be driven to corresponding voltages. Conveniently in these modes of operation, the n-wells can be connected to the first switching voltage node N1, as the voltage at the node N1 is sufficiently positive that any voltage drop due to load current will not result in leakage via an n-well to substrate diode. Thus, when operating in the unboosted mode or operation, where the voltage at node N1 is nominally at +VSUP, or in the positive boosted mode of operation, where the voltage at node N1 is nominally at +VSUP, NW switch SW3A may be closed to connect the NW node 411 to the first voltage node N1 and switch SW3B may be opened to isolate the NW node 411 from the ground node.

It will be understood that NW node 411 could be selectively connected or disconnected from the ground node 413 purely by the operation of switch SW3C alone. However, if switch SW3B were not present, then in the positive boosted mode of operation, with NW node 411 connected to node N1, one side of switch SW3C would be the switching voltage +2VSUP and the other side would be at ground, and there would be a voltage stress of magnitude 2VSUP across switch SW3C.

To avoid such a high voltage stress, switches SW3B is included and node 412 can be selectively coupled to the supply voltage VSUP by switch SW3D. Thus, when the switching driver circuit 400 operates in the positive boosted mode, and the voltage at the first switching voltage node N1 is more positive that the supply voltage VSUP, NWS 410 may operate in a second switch state, with NW switch SW3A closed and NW switch SW3B open, and also with NW switch SW3D closed (and SW3C) open, so that the voltage stress across SW3B is limited to the magnitude of the supply voltage.

When operating in the unboosted mode, where the nominal voltage at node N1 is equal to VSUP, NWS 410 may adopt the same second switch state, which in that case would result in no voltage differential across switch SW3B. However, in that case as the voltage at node 411 is at VSUP, it may be preferred for switch SW3D to be open, and switch SW3C to be closed so that node 412 is driven to ground. Thus, when operating in the unboosted mode of operation, NWS 410 may adopt a third switch state, with switches SW3A and SW3C closed, and switches SW3B and SW3D open.

Referring again to FIG. 4, in some examples, the n-wells of second output switch SWO2 and switch SW2C, which may be referred to as a second supply switch, may also be connected to the NWS 410.

As noted above, it may be desired that the n-wells of switches SWO2 and SW2C may also be driven with a voltage that varies with the switching voltages, i.e. mode of operation, to maintain correct biasing. As discussed above, it would be possible for the n-wells of switches SWO2 and SW2C to be driven to VSUP, in the positive boosted mode of operation when the voltage at node N2 is nominally at +VSUP, but for these n-wells to be driven to ground when operating in the unboosted mode (when the voltage at N2 is nominally at ground) and in the negative boosted mode (when the voltage at N2 is nominally at −VSUP). This could be achieved by connecting the n-wells of these switches to the node N4. However, as discussed above, this node N4 can form part of the output path and thus, in use in the unboosted mode of operation, where the voltage at node N4 is nominally at ground, a load current flowing via switch SW2B can result in the voltage at this node being pulled sufficiently below grounds so that a leakage current could flow between the n-wells and substrate of switches SWO2 and SW2C.

To avoid this problem, the n-wells of switches SWO2 and SW2C may be driven by a voltage from NWS 410.

In some examples, the n-wells of switches could be driven in the same way, i.e. with the same voltages, as switches SWO1 and SW1C, i.e. the n-wells of switches SWO2 and SW2C could be connected to the NW node 411 and hence to the n-wells of switches SWO1 and SW1C. In this case, the n-wells of switches SWO2 and SW2C are effectively driven with a voltage that corresponds to the high switching voltage at node N1 and which is derived from node N1 in the unboosted and positive boosted modes of operation and from a separate ground (which does not form part of an output path) in the negative boosted mode of operation. Switch SWO2 is connected between the node N2, which is at the low switching voltage, and the output node 203, which is switched between the high and low switching voltages. Thus driving the n-well of switch SWO2 to the high-side switching voltage maintains acceptable voltage. Switch SW2C is connected between node N2 (at the low switching voltage) and node N4. The voltage at node N4 is equal to low switching voltage at node N2 in the unboosted and positive boosted modes of operation and is held at ground, and so matches the high switching volate in the negative boosted mode. Again therefore, driving the n-well of switch SW2C with these voltages maintains acceptable voltage differentials for the switch.

It would, however, be possible to driver the n-wells of switches SWO2 and SW2C in other ways, for instance the n-wells of these switches could be connected to node 412 of the NWS 410, which can be maintained at ground (independent of an output path) in the negative boosted and unboosted modes or operation and at +VSUP in the positive boosted mode. Alternatively the n-wells of these switches could be connected via separate switches (not illustrated) to either the positive supply VSUP or a ground node which is separate from an output path. The n-wells could be switched to the positive supply when switch SW2C is on (in either of the unboosted or positive boosted modes of operation) and to the separate ground when switch SW2C is off (in the negative boosted mode).

Embodiments of the present disclosure thus relate to switch driver circuitry comprising an output stage switch connected to at least a first controlled voltage node for receiving a controlled voltage, e.g. a switching voltage, to be output to a load. The switch driver circuitry is operable in a plurality of modes, wherein the switching voltage at the first voltage node may be controllably varied in the different modes, including a first mode where the switching voltage is nominally at ground and at least one other mode where the switching voltage is a positive voltage. The output stage comprises a first output switch connected between the first controlled voltage node and the output, where the switch comprises a transistor, e.g. a MOS device, with an n-well. The switch driver circuitry is operable to connect the n-well of the first output switch to a ground node, different than the first supply node, when the controlled voltage node is coupled to a ground voltage supply via a switching path. With this operation, switch driver circuitry according to the present disclosure may at least partly mitigate current leakage effects that can occur at the output stage switch due to current draw at the first voltage node.

Embodiments may be implemented as an integrated circuit. Embodiments may be implemented in a host device, especially a portable and/or battery powered host device such as a mobile computing device for example a laptop, notebook or tablet computer, or a mobile communication device such as a mobile telephone, for example a smartphone. The device could be a wearable device such as a smartwatch. The host device could be a games console, a remote control device, a home automation controller or a domestic appliance, a toy, a machine such as a robot, an audio player, a video player. It will be understood that embodiments may be implemented as part of a system provided in a home appliance or in a vehicle or interactive display. There is further provided a host device incorporating the above-described embodiments.

The skilled person will recognise that some aspects of the above-described apparatus and methods, for instance aspects of controlling the switching control signals to implement the different modes, may be embodied as processor control code, for example on a non-volatile carrier medium such as a disk, CD- or DVD-ROM, programmed memory such as read only memory (Firmware), or on a data carrier such as an optical or electrical signal carrier. For some applications, embodiments may be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high-speed integrated circuit Hardware Description Language). As the skilled person will appreciate, the code may be distributed between a plurality of coupled components in communication with one another.

Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A switching driver circuit for driving a load, the switching driver circuit comprising:
    an output stage comprising: an output node for outputting a driving signal to the load; and a first output switch connected between a first switching voltage node and the output node, wherein the first output switch comprises an n-well; and
    a switch network operable to control a switching voltage at said first switching voltage node;
    wherein the switching driver circuit is operable in a plurality of modes in which the first switching voltage is different in each mode, the plurality of modes comprising at least: a mode in which the first switching voltage node is coupled to a positive voltage; and a mode in which the first switching voltage node is coupled to a ground voltage supply via a first switching path of the switch network; and
    an n-well switching block operable, when the first switching voltage node is coupled to a positive voltage, to connect the n-well of the first output switch to the first switching voltage node, and operable, when the first switching voltage node is coupled to the ground voltage supply, to connect the n-well of the first output switch to a first ground node at a ground voltage, where the first ground node is separate to the first switching voltage node and independent of the first switching path.

2. The switching driver circuit according to claim 1 wherein the first switching path comprises at least a first supply switch with a terminal connected to the first switching voltage node and the first supply switch comprises an n-well; and wherein the n-well switching block is further operable, when the first switching voltage node is connected to the ground voltage supply, to connect the n-well of the first supply switch to the first ground node.

3. The switching driver circuit according to claim 2 wherein the n-well switching block is further operable, when the first switching voltage node is connected to a positive voltage, to connect the n-well of the first supply switch to the first switching voltage node.

4. The switching driver circuit according to claim 3 wherein:
    the output stage further comprises a second output switch connected between a second switching voltage node and the output node, wherein the second output switch comprises an n-well;
    wherein the switch network is also operable to control the voltage at the second switching voltage node such that the second switching voltage is different in each mode;
    wherein the n-well switching block is further configured to control a voltage supplied to n-well of the second output switch based on the second switching voltage.

5. The switching driver circuit according to claim 4 wherein the n-well of the second output switch is connected to the n-well of the first output switch.

6. The switching driver circuit according to claim 4 wherein in one mode of operation the second switching voltage node is coupled to the ground voltage supply via a second switching path that comprises at least a second supply switch of the switch network; and wherein the n-well switching block is operable, when the second switching voltage node is coupled to the ground voltage supply, to connect the n-well of the second supply switch to the first ground node, wherein the first ground node is independent of the second switching path.

7. The switching driver circuit according to claim 5 wherein a terminal of the second supply switch is connected to the second switching voltage node and the second supply switch comprises an n-well and wherein the n-well switching block is further configured to control a voltage supplied to n-well of the second supply switch to be the same as the voltage supplied to the n-well of the second output switch.

8. The switching driver circuit according to claim 1 wherein the n-well switching block comprises:
a first n-well block switch for selectively connecting a first n-well voltage node to the first switching voltage node, wherein the first n-well voltage node is coupled to the n-well of the first output switch.

9. The switching driver circuit according to claim 8 wherein the n-well switching block further comprises:
a second n-well block switch for selectively connecting the first n-well voltage node to a supply select node;
a third n-well block switch for selectively connecting the supply select node to the first ground node; and
a fourth n-well block switch for selectively connecting the supply select node to a positive voltage supply node.

10. The switching driver circuit according to claim 9 wherein the n-well switching block is configured such that, when the first switching voltage node is connected to the ground voltage supply:
the first n-well block switch is open to disconnect the first n-well voltage node from the first switching voltage node;
the second and third n-well block switches are closed to connect the n-well node voltage to the first ground node; and
the fourth n-well block switch is open.

11. A switching driver circuit according to claim 9 wherein the switching driver circuit is operable in a mode in which the first switching voltage node is coupled to a positive voltage substantially equal to a voltage of the positive voltage supply node and in which:
the first n-well block switch is closed to connect the first n-well voltage node to the first switching voltage node; and
the second n-well block switch is open to disconnect the first n-well voltage node from the supply select node; and
the third n-well block switch, with the fourth n-well block switch closed so that the supply select node is coupled to the first ground node.

12. A switching driver circuit according to claim 9 wherein the switching driver circuit is operable in a mode in which the first switching voltage node is coupled to a positive voltage which is more positive than a voltage of the positive voltage supply node and in which:
the first n-well block switch is closed to connect the first n-well voltage node to the first switching voltage node; and
the second and third n-well block switches are open to disconnect the n-well voltage node from the supply select node; and
the fourth n-well block switch is closed to connect the supply select node to the positive voltage supply node.

13. The switching driver circuit according to claim 9 wherein the output stage further comprises a second output switch connected between a second switching voltage node and the output node, wherein the second output switch comprises a n-well, and wherein the n-well of the second output switch is coupled to either the first n-well voltage node or the supply select node of the n-well switching block.

14. The switching driver circuit according to claim 4 wherein said plurality of modes comprises:
a first mode in which the network of switches is configured to connect the first switching voltage node to a positive input voltage supply and to connect the second switching voltage node to said ground voltage supply;
a second mode in which the network of switches is configured to connect the first switching voltage node to said ground voltage supply and to connect the second switching voltage node to a negative boosted voltage;
a third mode in which the network of switches is configured to connect the first switching voltage node to a positive boosted voltage and to connect the second switching voltage node to a negative boosted voltage.

15. The switching driver circuit according to claim 14 further comprising a capacitor, and where the network of switches is operable such that the capacitor is charged between the positive input voltage supply and the ground voltage supply and selectively connected in series with the positive input voltage supply to provide the positive boosted voltage or connected in series with the ground voltage supply to provide the negative boosted voltage.

16. The switching driver circuit according to claim 1 wherein said output stage is a first output stage and the switching driver circuit further comprises a second output stage and the switching driver circuit is configured to drive the load in a bridge-tied-load configuration between the first and second output stages.

17. The switching driver circuit according to claim 1 wherein the load comprises at least one of: an audio output transducer; haptic output transducer; a piezoelectric transducer and a ceramic transducer.

18. An electronic device comprising the switching driver circuit according to claim 1.

* * * * *

UNITED STATES PATENT AND TRADEMARK OFFICE
CERTIFICATE OF CORRECTION

| | |
|---|---|
| PATENT NO. | : 11,469,753 B1 |
| APPLICATION NO. | : 17/365201 |
| DATED | : October 11, 2022 |
| INVENTOR(S) | : Sadati et al. |

It is certified that error appears in the above-identified patent and that said Letters Patent is hereby corrected as shown below:

On the Title Page

1. In Item (71), under "Applicant", in Column 1, Lines 1-2, delete "Cirrus Logic international Semiconductor Ltd.," and insert -- Cirrus Logic International Semiconductor Ltd., --, therefor.

In the Specification

2. In Column 1, Line 31, delete "from another" and insert -- from one another --, therefor.

3. In Column 3, Line 38, delete "in in" and insert -- in --, therefor.

4. In Column 5, Line 37, delete "driver signal" and insert -- drive signal --, therefor.

5. In Column 6, Line 15, delete "output bridge stage 202." and insert -- output bridge stage 201. --, therefor.

6. In Column 6, Line 41, delete "output stage 203," and insert -- output stage 201, --, therefor.

7. In Column 6, Line 53, delete "referred to a" and insert -- referred to as a --, therefor.

8. In Column 8, Line 32, delete "switching driver 201" and insert -- switching driver 200 --, therefor.

9. In Column 11, Line 30, delete "that which" and insert -- which --, therefor.

10. In Column 11, Line 62, delete "referred to a" and insert -- referred to as a --, therefor.

11. In Column 12, Line 45, delete "mode or operation," and insert -- mode of operation, --, therefor.

12. In Column 12, Line 65, delete "that" and insert -- than --, therefor.

Signed and Sealed this
Twenty-seventh Day of August, 2024

Katherine Kelly Vidal
*Director of the United States Patent and Trademark Office*

CERTIFICATE OF CORRECTION (continued)
U.S. Pat. No. 11,469,753 B1

13. In Column 13, Line 60, delete "volate" and insert -- voltage --, therefor.

14. In Column 13, Line 64, delete "to driver" and insert -- to drive --, therefor.

In the Claims

15. In Column 17, Line 15, in Claim 7, delete "the second supply switch" and insert -- a second supply switch --, therefor.

16. In Column 18, Line 36, in Claim 14, delete "a negative boosted voltage." and insert -- the negative boosted voltage. --, therefor.